(12) United States Patent
Andrews et al.

(10) Patent No.: US 8,536,042 B2
(45) Date of Patent: Sep. 17, 2013

(54) METHOD OF FORMING A TOPSIDE CONTACT TO A BACKSIDE TERMINAL OF A SEMICONDUCTOR DEVICE

(75) Inventors: John T. Andrews, Eagle Mountain, UT (US); Hamza Yilmaz, Saratoga, CA (US); Bruce Marchant, Murray, UT (US); Ihsiu Ho, Salt Lake City, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 65 days.

(21) Appl. No.: 12/982,509

(22) Filed: Dec. 30, 2010

(65) Prior Publication Data
US 2011/0097894 A1    Apr. 28, 2011

Related U.S. Application Data

(62) Division of application No. 12/168,348, filed on Jul. 7, 2008, now Pat. No. 7,884,390.

(60) Provisional application No. 60/977,026, filed on Oct. 2, 2007.

(51) Int. Cl.
*H01L 21/44* (2006.01)

(52) U.S. Cl.
USPC ........... 438/597; 438/233; 438/618; 438/620; 257/61; 257/343; 257/624; 257/E29.258

(58) Field of Classification Search
USPC .......... 438/233, 399, 597, 618, 620, 621; 257/263, 278, 302, 328, 329, 330, 342, 418, 257/E29.201, E29.257, E29.261, E29.267, 257/E21.375, E21.376, E21.377, E21.383
See application file for complete search history.

(56) References Cited

U.S. PATENT DOCUMENTS

| | | | |
|---|---|---|---|
| 5,391,895 A * | 2/1995 | Dreifus | 257/77 |
| 6,127,715 A | 10/2000 | Yamamoti et al. | |
| 6,373,100 B1 * | 4/2002 | Pages et al. | 257/343 |
| 6,392,290 B1 | 5/2002 | Kasem et al. | |

(Continued)

FOREIGN PATENT DOCUMENTS

| | | | |
|---|---|---|---|
| JP | 2008251923 | * | 10/2008 |
| WO | WO 2006/017376 A2 | | 2/2006 |

OTHER PUBLICATIONS

International Search Report of the International Searching Authority for Application No. PCT/US2008/077736, mailed on Dec. 8, 2008, 1 page.

(Continued)

*Primary Examiner* — A. Sefefr
*Assistant Examiner* — Farid Khan

(57) ABSTRACT

A process for forming a vertically conducting semiconductor device includes providing a semiconductor substrate having a topside surface and a backside surface. The semiconductor substrate serves as a terminal of the vertically conducting device for biasing the vertically conducting device during operation. The process also includes forming an epitaxial layer extending over the topside surface of the semiconductor substrate but terminating prior to reaching an edge of the semiconductor substrate so as to form a recessed region along a periphery of the semiconductor substrate. The method also includes forming an interconnect layer extending into the recessed region but terminating prior to reaching an edge of the semiconductor substrate. The interconnect layer electrically contacts the topside surface of the semiconductor substrate in the recessed region to thereby provide a topside contact to the semiconductor substrate.

18 Claims, 9 Drawing Sheets

(56) References Cited

U.S. PATENT DOCUMENTS

| | | |
|---|---|---|
| 6,653,740 B2 | 11/2003 | Kinzer et al. |
| 7,345,342 B2 | 3/2008 | Challa et al. |
| 7,579,650 B2 * | 8/2009 | Cao et al. .................. 257/333 |
| 7,855,453 B2 * | 12/2010 | Yoshida et al. ............. 257/737 |
| 7,884,390 B2 | 2/2011 | Andrews et al. |
| 2001/0000068 A1 | 3/2001 | Isogai et al. |
| 2002/0047175 A1 | 4/2002 | Tani et al. |
| 2003/0015756 A1 | 1/2003 | Farber et al. |
| 2004/0245638 A1 | 12/2004 | Nemtsev et al. |
| 2006/0030142 A1 * | 2/2006 | Grebs et al. ................ 438/618 |
| 2007/0075372 A1 * | 4/2007 | Terashima et al. .......... 257/360 |
| 2007/0145514 A1 | 6/2007 | Kocon |

OTHER PUBLICATIONS

Written Opinion of the International Searching Authority for Application No. PCT/US2008/077736, mailed on Dec. 8, 2008, 6 page.
Preliminary Report on Patentability for Application No. PCT/US2008/077736, mailed on Apr. 15, 2010, 7 pages.
Non-Final Office Action for U.S. Appl. No. 12/168,348, mailed on Apr. 14, 2010, 32 pages.
Notice of Allowance for U.S. Appl. No. 12/168,348, mailed on Nov. 26, 2010, 10 pages.

* cited by examiner

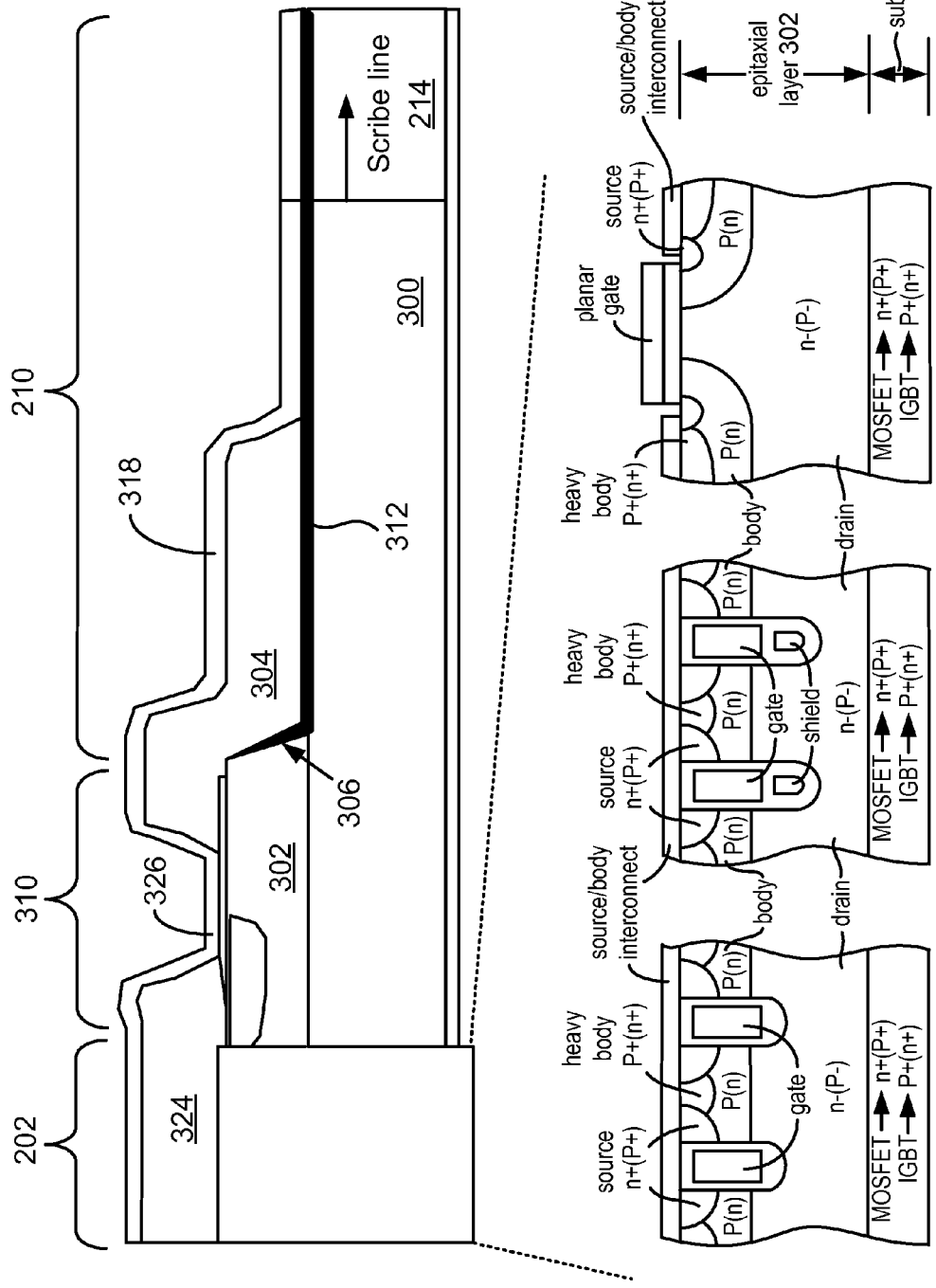

METHOD OF FORMING A TOPSIDE CONTACT TO A BACKSIDE TERMINAL OF A SEMICONDUCTOR DEVICE

CROSS-REFERENCE TO RELATED APPLICATIONS

This application is a divisional of U.S. patent application Ser. No. 12/168,348, filed Jul. 7, 2008, which claims the benefit of U.S. Provisional Appln. No. 60/977,026, filed Oct. 2, 2007, the disclosures of which are incorporated herein by reference in their entirety for all purposes.

BACKGROUND

The present invention relates in general to semiconductor devices, and more particularly to a method and structure for making a topside contact to a semiconductor substrate.

In some semiconductor devices (e.g., vertically-conducting power devices), the substrate forms a bottom terminal of the device, and various techniques have been used to form a low resistance contact to the bottom terminal. FIG. 1A shows a cross-sectional view of a conventional device structure with a backside contact. As shown, a N− region 101 is formed over a N+ substrate region 102. A conductive interconnect layer 103 formed at the bottom of the substrate is used as a backside contact. For certain applications it may be desirable to contact the substrate from the topside of the device. FIGS. 1B-1C show cross-section views illustrating two conventional techniques for contacting the bottom terminal of a device through the topside.

In FIG. 1B, a heavily doped diffused region 105 extends through N− region 101 to reach N+ substrate region 102. A conductive interconnect layer 107 is formed over diffused region 105, which together with diffused region 105 forms a topside contact to N+ substrate region 102. In FIG. 1C, a deep trench 108 is formed through N− region 101 to reach N+ substrate region 102. Then a conductive material 109 is used to fill the trench, thus forming a topside contact to N+ substrate region 102.

Even though these conventional techniques have been used for making topside contact to the bottom terminal, there are limitations associated with these techniques. For example, diffused region 105 in FIG. 1B requires a high temperature drive-in process after a diffusion or implant step. This leads to wide lateral out-diffusion and high thermal budget. In FIG. 1C, the process of making a deep trench and then filling it with a conductive material is often complicated. If polysilicon is used to fill the trench, it is often difficult to obtain highly doped polysilicon to form a low resistivity topside contact.

Thus, there is a need for a technique whereby a low resistance topside contact is made to the substrate while maintaining a simple manufacturing process.

BRIEF SUMMARY

In accordance with an embodiment of the invention, a vertically conducting semiconductor device includes a semiconductor substrate having a topside surface and a backside surface. The semiconductor substrate serves as a terminal of the vertically conducting device for biasing the vertically conducting device during operation. An epitaxial layer extends over the topside surface of the semiconductor substrate but terminates prior to reaching an edge of the semiconductor substrate so as to form a recessed region along a periphery of the semiconductor substrate. An interconnect layer extends into the recessed region but terminates prior to reaching an edge of the semiconductor substrate. The interconnect layer electrically contacts the topside surface of the semiconductor substrate in the recessed region to thereby provide a topside contact to the semiconductor substrate.

In accordance with another embodiment of the invention, a process for forming a vertically conducting semiconductor device includes the following steps. A semiconductor substrate having a topside surface and a backside surface is provided, where the semiconductor substrate serves as a terminal of the vertically conducting device for biasing the vertically conducting device during operation. An epitaxial layer is formed extending over the topside surface of the semiconductor substrate but terminating prior to reaching an edge of the semiconductor substrate so as to form a recessed region along a periphery of the semiconductor substrate. An interconnect layer is formed extending into the recessed region but terminating prior to reaching an edge of the semiconductor substrate, wherein the interconnect layer electrically contacts the topside surface of the semiconductor substrate in the recessed region to thereby provide a topside contact to the semiconductor substrate.

These and other embodiments as well as advantages and features of the invention are described in more detail below using FIGS. 2-7.

BRIEF DESCRIPTION OF THE DRAWINGS

FIGS. 5A-5F are simplified cross-sectional views illustrating various process steps for forming a topside contact to a substrate according to an embodiment of the present invention;

FIGS. 7A-7C are simplified cross-sectional views illustrating implementation of the topside contact to substrate in various types of devices.

DETAILED DESCRIPTION

In accordance with embodiments of the invention, various techniques are described for forming a topside contact to a bottom terminal of a semiconductor device. In one embodiment, a die houses a vertically conducting semiconductor device. The vertically conducting semiconductor device includes a substrate with a silicon layer extending over the substrate. The silicon layer includes the active region of the die and is recessed along a periphery of the die so as to expose surface regions of the substrate along the periphery of the die. A topside interconnect layer extends in the recessed areas and electrically contacts the substrate along the exposed surface regions of the substrate. In one embodiment, the recessed areas extend out to the edge of the die, and the topside interconnect layer extends partially into the recessed area so that outer portions of the recessed areas remain uncovered by the interconnect layer. In another embodiment, the substrate is made thinner than conventional substrates and an interconnect layer is formed on the backside of the substrate. This helps reduce the on-resistance and improve heat dissipation. Further, the thin structure along the periphery of the die (due to absence of the silicon layer, the absence of the topside interconnect layer, and the thinner substrate) helps minimize the potential damage from the die saw process. These and other embodiments as well as other features and advantages of the invention will be described in more detail next.

Figure 2:
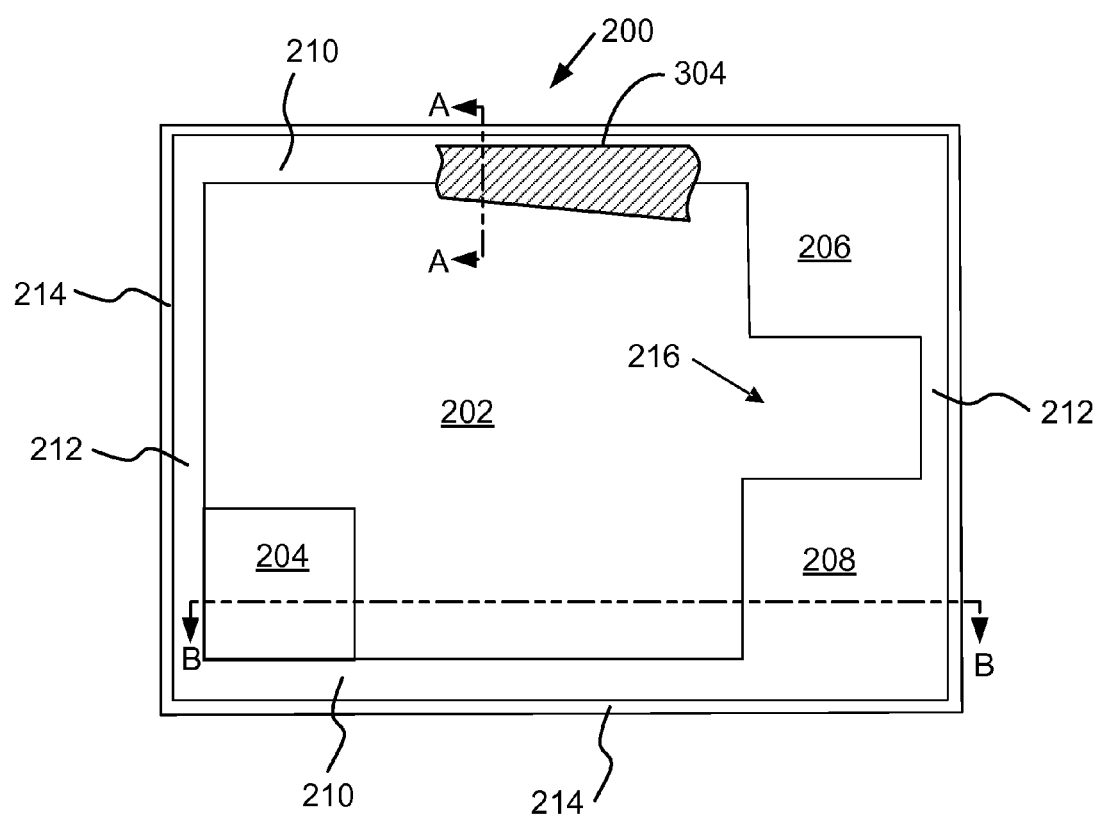
FIG. 2 is a simplified layout diagram of a device with a topside contact to a substrate according to an exemplary embodiment of the present invention.

FIG. 2 is a simplified layout diagram of a device with a topside contact to the backside according to an embodiment of the present invention. For example, FIG. 2 is a layout diagram of a vertical device 200 configured to achieve an optimum balance between active area consumption and resistance of the topside contact to the substrate. Device 200 includes active area 202, gate region 204, and drain regions 206, 208. Drain regions 206, 208 and gate region 204 may be of sufficient size to act as pad contacts for chip-scale packaging. Active area 202 is at least partially surrounded by extensions 210, 212 of the drain recess regions 206, 208. Extended drain recess regions 210, 212 may vary in width. For example, drain recess region 210 may be narrower than drain recess region 212 to maximize the active area. Alternatively, recessed drain regions 210, 212 may be thinnest in areas furthest away from drain regions 206, 208. In another embodiment, the topside interconnect layer extending into the recessed areas may have a narrower width in areas further away from the pad area. Or, a thickness of the recessed drain regions 210, 212 may increase in the direction from the furthest point from drain regions 206, 208 towards drain regions 206, 208.

By extending the recessed drain regions 206, 208 around active region 202, the contribution of the topside drain contact to $Rds_{on}$ is reduced by up to about 30%. Edge regions 214 demarcate scribe line regions for separating adjacent dice on a wafer and may also be recessed. However, edge regions 214 do not contain the topside interconnect layer that extends in the recessed drain regions 206, 208, 210, 212 to contact the substrate. Given the reduced thickness of the silicon in the scribe line areas (due to the drain recess) and the absence of metal interconnect in the scribe line areas, the extent of damage from the die saw process is substantially minimized.

In a specific embodiment of the invention, device 200 may have six pad locations for receiving solder balls in a 3×2 configuration (i.e., 2 rows of 3 solder balls each): two pads located at drain regions 206, 208, one pad located at gate region 204, and three pads located at active area 202. This configuration enables extending active region 202 between drain pad regions 206, 208 (marked as notched active region 216), thereby maximizing the active area of the device. According to embodiments of the invention, the placement, size, number, and shape of the various areas and pad contacts can be selected to achieve an optimum balance between maximum active area and minimum resistance of the topside contact to the substrate. For example, the recessed regions are not limited to extending to the perimeter of the die and may extend into the middle of the die. Other placement configurations can be envisioned by one skilled in the art in view of this disclosure.

Figure 3:
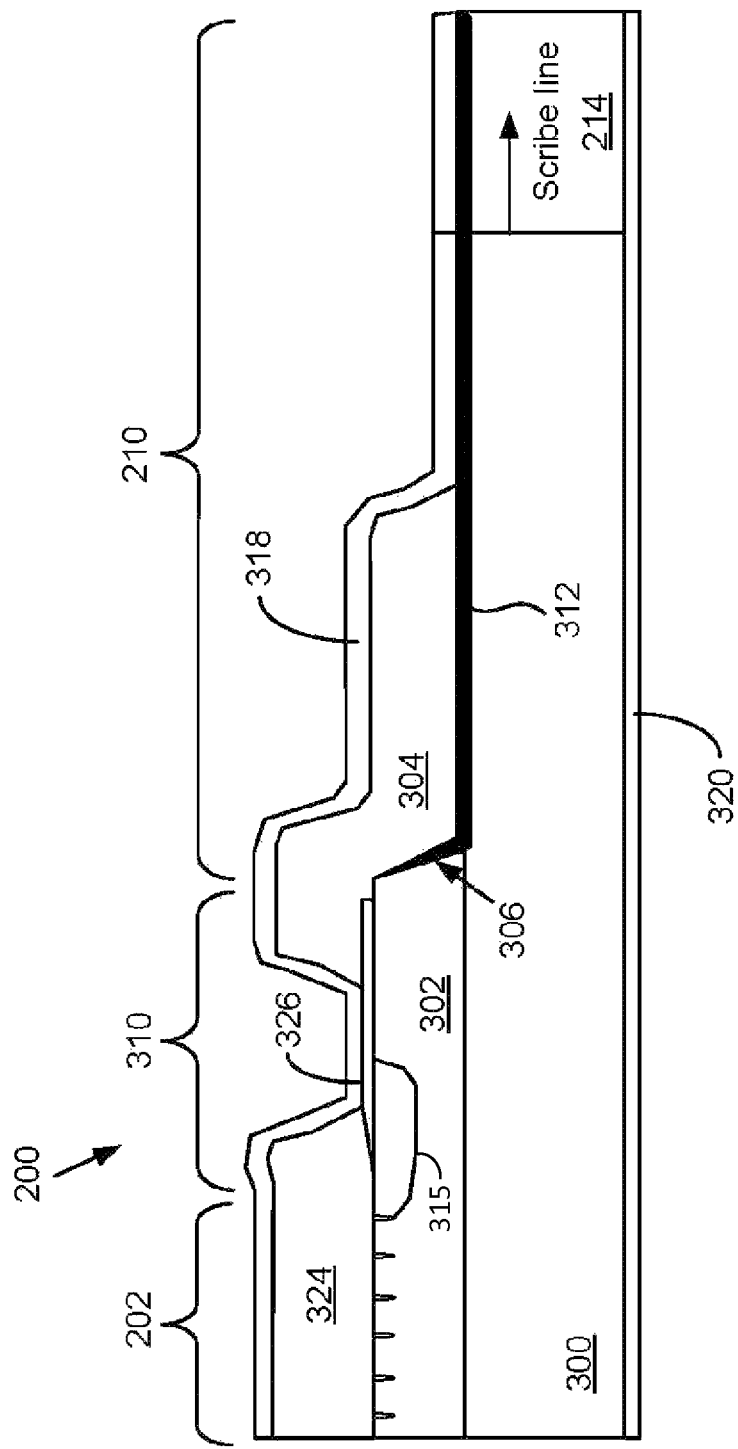
FIG. 3 is a simplified cross-sectional view along cut line A-A in FIG. 2.

FIG. 3 is a simplified cross-sectional view of the device shown in FIG. 2 along cut line A-A. Device 200 may be a vertical field effect transistor fabricated on a semiconductor die that includes substrate 300 and epitaxial layer 302 extending over substrate 300. In one embodiment, substrate 300 is made much thinner than a conventional substrate, and a highly conductive interconnect layer 320 (e.g. comprising a metal such as aluminum or copper) is formed on the backside surface of substrate 300. By using a thinner substrate 300, process robustness may be increased by reducing the amount of substrate 300 that must be cut through during die saw. Additionally, heat dissipation is significantly improved by using a thin substrate 300 together with the highly conductive interconnect layer 320. Further, the combination of a thinner substrate and a highly conductive backside interconnect 320 substantially minimizes substrate's contribution to $Rds_{on}$. However, device 200 may also be formed using a typical substrate with a greater thickness without conductive layer 320 depending upon the desired design goals and device performance criteria. In one embodiment, backside interconnect layer 320 is formed by performing a backside metal deposition.

Figure 1A:
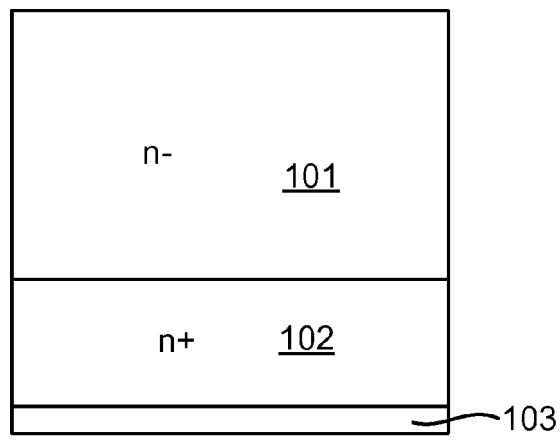
FIGS. 1A-1C are cross-sectional views of structures illustrating conventional techniques for providing a topside contact to a substrate.
Figure 1B:
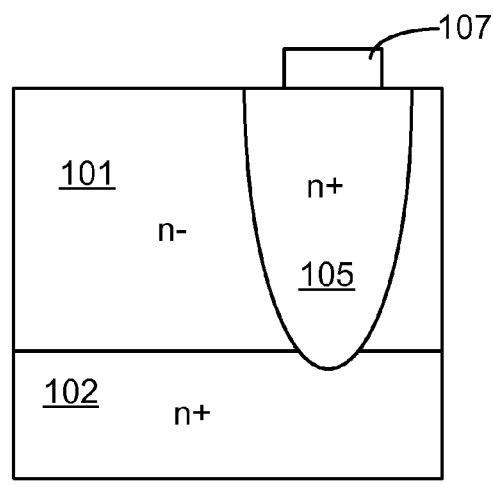
Figure 1C:
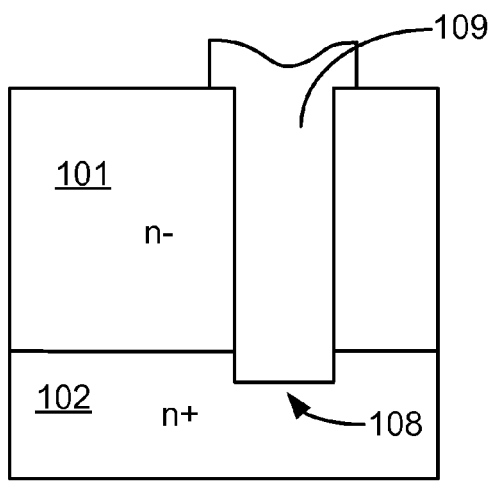

Epitaxial layer 302 overlies a portion of substrate 300 and includes active area 202 where active structures are formed. In one embodiment, the thickness of epitaxial layer 302 is in the range of 3-12 µm with substrate 300 having a thickness in the range of 50-700 µm. In a specific embodiment, the thickness of epitaxial layer 302 is initially about 7 µm and is reduced to a thickness of 5 µm at the end of processing due to up-diffusion of the substrate. The thickness of epitaxial layer 302 may be up to 35% thinner than conventional implementations, which reduces the overall cost of manufacturing the device. Further, conventional sinker processes as shown in FIG. 1B require an additional anneal step to diffuse the dopants into the substrate, which is no longer required. This reduces the thermal budget and up-diffusion variations.

Separating active area 202 from the remainder of device is termination region 310. For example, termination region 310 may be formed using a local oxidation of silicon (LOCOS) process that creates field oxide regions 315 for use as isolation structures between the active area and periphery of the device. Epitaxial layer 302 terminates with a sloped sidewall 306 where recessed region 210 begins. In the embodiment shown, recessed region 210 extends through the scribe line region 214 to the edge of the die. The sloped sidewall of epitaxial layer 302 may have an angle in the range of 45-90 degrees depending upon the specific processes used. The slope on the sidewall can allow for better step coverage and enable deposition and coverage of a photoresist layer during lithography. Alternatively, sidewall 306 may have an isotropic sidewall profile. A highly conductive topside interconnect layer 304 (e.g., comprising a metal) extends into recessed region 210 to contact a top surface of substrate 300 in the recessed regions. An implant region 312 of the same conductivity type as substrate 300 may be formed along the sidewall of epitaxial layer 302 and along the surface regions of substrate 300 in recessed region 210 to reduce the resistance of the contact between interconnect 304 and substrate 300. A conventional optimized implantation process may be used to achieve the desired contact resistance depending upon the application.

In one embodiment, active region 202 includes a power MOSFET with topside interconnect 324 serving as the source interconnect and topside interconnect 304 serving as the drain interconnect contacting substrate 300. Drain interconnect 304, source interconnect 324, and gate interconnect (not shown) may be formed at the same time using a masking step. Where drain recess region 210 extends along the perimeter of the die, drain interconnect 304 advantageously forms an equal potential ring around active area 202. In the embodiment shown, drain interconnect 304 is terminated before reaching the scribe line. This serves as a buffer against any potential damage during the die saw process reaching the active region. Dielectric layer 326 (e.g., comprising oxide) extends over epitaxial layer 302 in the region between topside interconnect layers 304 and 324. An insulating layer 318

(e.g., comprising one or more of oxynitride, polyimide, and BCB) extending over and between the topside interconnect layers functions as a passivation layer and helps define the pad areas (not shown).

Figure 4:
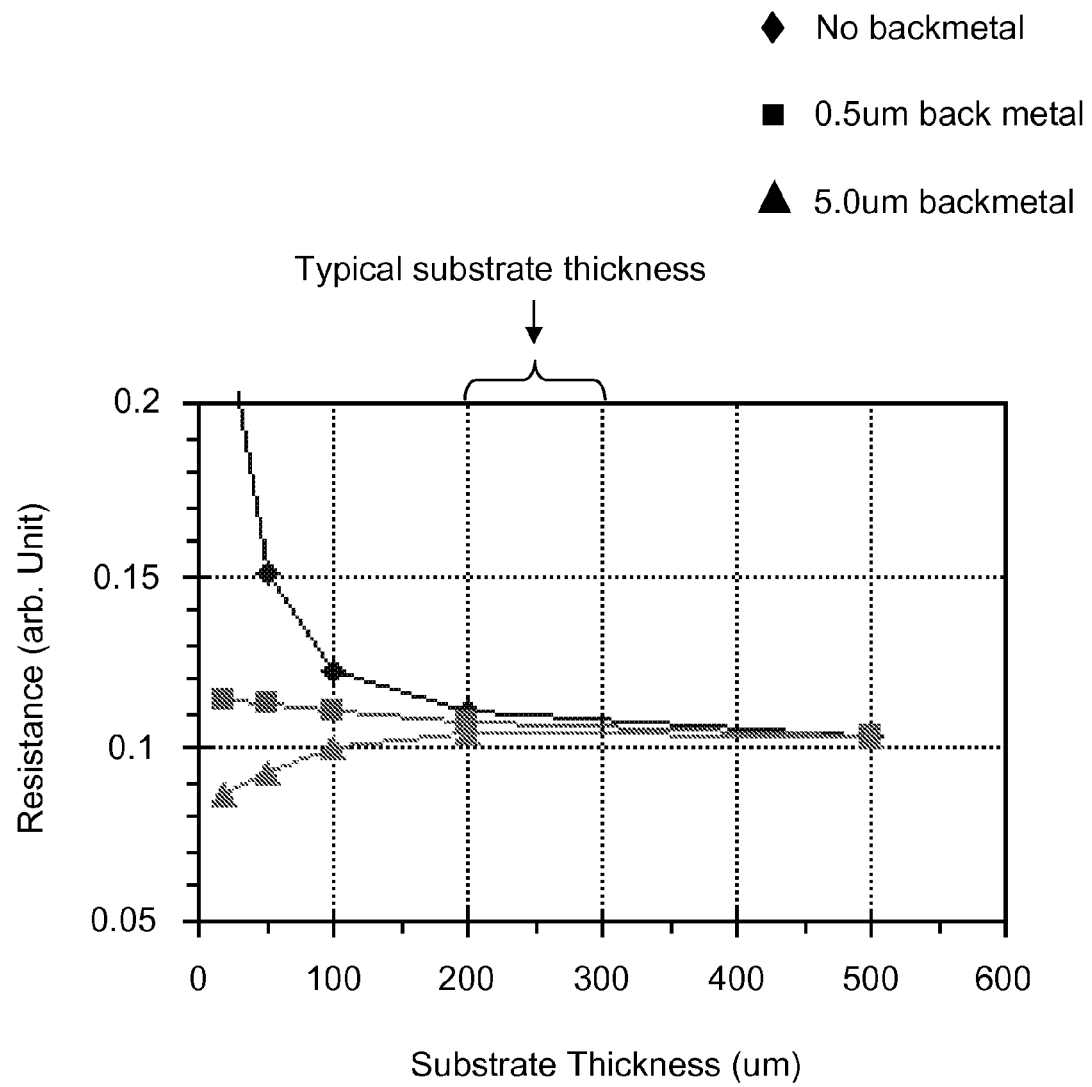
FIG. 4 is a graph showing the substrate resistance versus substrate thickness for three cases: no back metal, back metal having 0.5 μm thickness, and back metal having 5 μm thickness.

FIG. 4 is a graph showing the substrate resistance versus substrate thickness for three cases of no back metal, back metal having 0.5 μm thickness, and back metal having 5 μm thickness. While minimal improvement in resistance is seen in using backside interconnect for the typical substrate thicknesses between 200-300 μm, the benefits of a backside interconnect layer become pronounced as substrate thickness shrinks. As shown, the inclusion of a backside interconnect becomes increasingly important for substrate thicknesses in the range of 50-200 μm. A typical back metal thickness is around 7 μm, but that may gradually increase as a lower resistance is required for device functionality. As the technological trend moves from the current substrate thickness of 200 μm towards substrate thicknesses between 50-150 μm, the improved resistance obtained as a result of using thinner substrates with thick back metal becomes increasingly important.

Figures 5A, 5B:
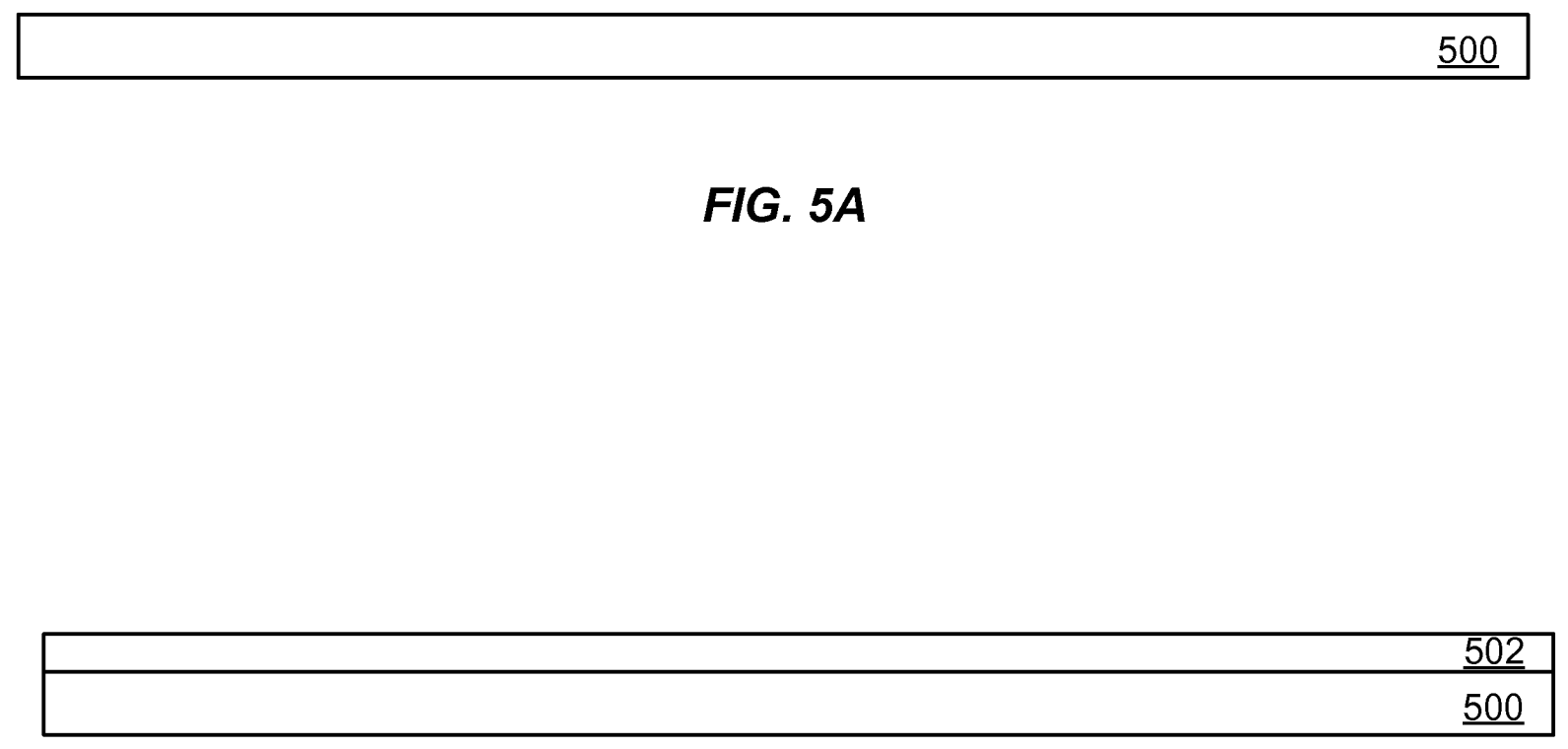
Figure 5C:
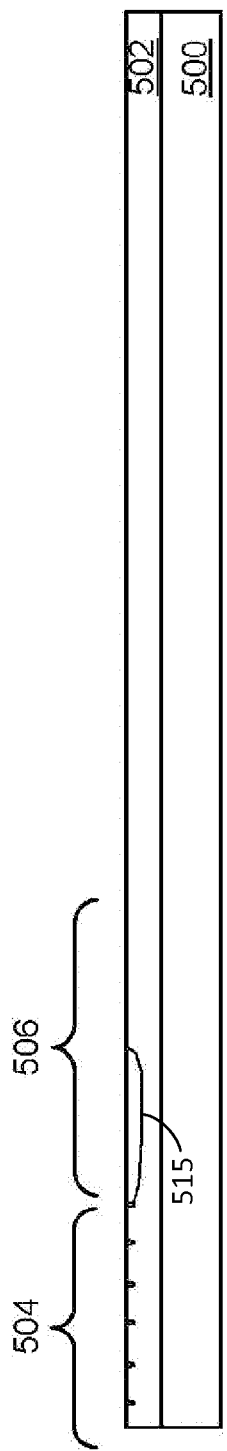

FIGS. 5A-5F are simplified cross section views at various steps of a process for forming the structure in FIG. 3 according to an embodiment of the present invention. In FIG. 5A, a semiconductor substrate 500 is provided. In one embodiment, semiconductor substrate 500 comprises silicon. Depending upon the device type, substrate 500 can be N-type or P-type. In other embodiments, substrate 500 may comprise SiC or GaN. In FIG. 5B, an epitaxial layer 502 is formed over substrate 500 using a conventional deposition or selective epitaxial growth (SEG) process. Epitaxial layer 502 may be doped N-type or P-type dependant upon the specific constraints of the device to be formed.

In FIG. 5C, a device structure is formed in active region 504 of the die. For example, a portion of a vertical MOSFET utilizing a trenched gate design can be fabricated in active region 504. However, other device structures can also be fabricated within active region 504, as can be appreciated by those of skill in the art. For example, the layout of active region 504 can be tailored to specific device applications as described below in connection with FIGS. 7A-7C. Termination structures, e.g., a field oxide region 515, surrounding the active region 504 may be formed in termination region 506 when the active structure(s) is(are) formed.

Figure 5D:
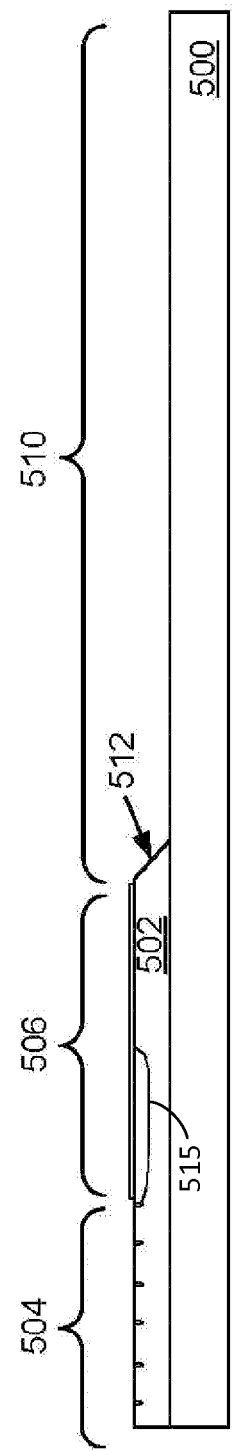

In FIG. 5D, an outer portion of epitaxial layer 502 is recessed. This may be performed by first using a conventional photolithography process and subsequently performing a wet or dry silicon etch to remove the outer portion of epitaxial layer 502. The etch process may be tailored to obtain a sloped sidewall 512. The inclusion of sloped sidewall 512 provides better step coverage for subsequent process steps (e.g., enables deposition of a photoresist layer despite the added topography). If a dry silicon etch is performed, a sidewall angle in the range of 70-90 degrees can be obtained, and if a wet etch process is performed, a sidewall angle in the range of 45 degrees may be obtained. Different sidewall angles may be formed by modifying process parameters and conditions as may be appreciated by those of skill in the art. The removal of the outer portion of epitaxial layer 502 forms a recessed region 510 where a surface of substrate 500 is exposed.

In an alternative embodiment, instead of forming and patterning the epitaxial layer, a selective epitaxial growth (SEG) process may be used to form the epitaxial layer. For example, a SEG process may be used to selectively form the epitaxial layer without requiring a subsequent patterning process to remove unwanted portions of the epitaxial layer.

Figure 5E:
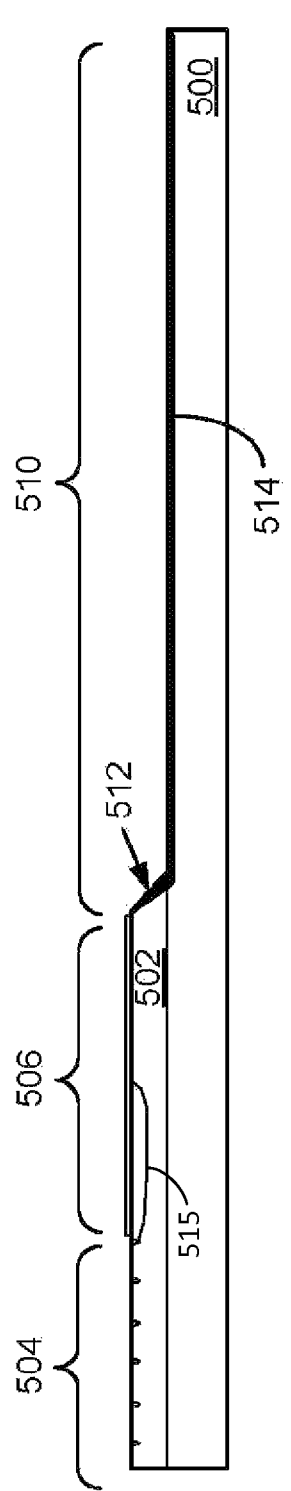

In FIG. 5E, dopants are implanted in the recessed region to form implant region 514 in substrate 500. Implant region 514 extends along the sloped sidewall 512 and an upper region of substrate 500 exposed in recessed region 510. Implant region 514 provides a highly doped region for forming a low resistance topside contact to substrate 500. During the implant, active region 504 and termination region 506 are masked off. Parameters and conditions for the implant process may be varied to achieve the desired contact resistance as may be appreciated by those of skill in the art.

Figure 5F:
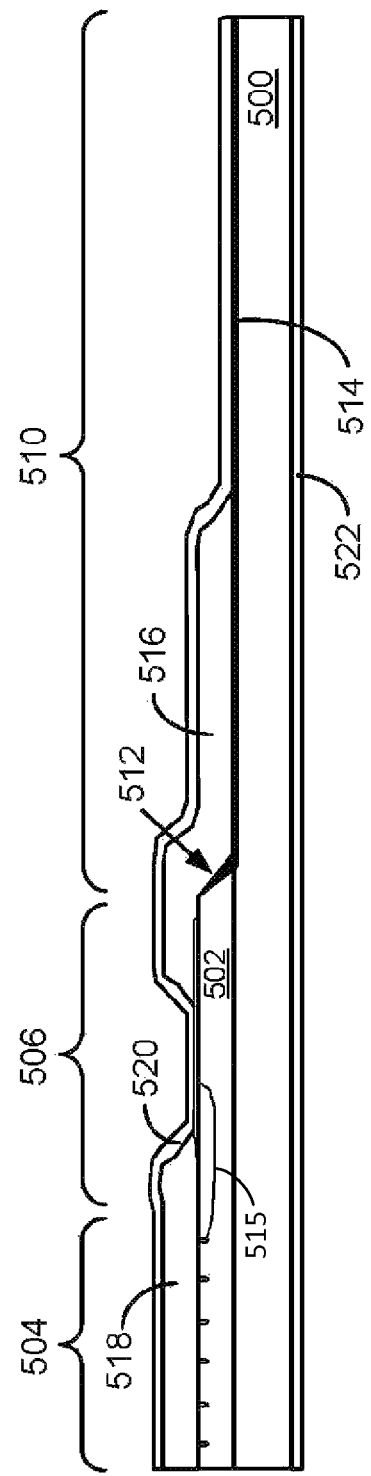

In FIG. 5F, a topside interconnect layer 516, such as a metal or other highly conductive material, is formed so that it extends into recessed region 510 to form a topside contact to substrate 500. During the same process, using known masking techniques, other topside interconnect layers, for example, source interconnect 518 in active region 504 and gate interconnect (not shown) are formed. An insulating layer 520 is deposited extending over and between the topside interconnect layers 516 and 518. Insulating layer 520 can be used as a passivation layer and also used to define the various pad areas such as gate, source and drain pad regions in a plane perpendicular to that shown in FIG. 5F.

A backside interconnect layer 522 (e.g. comprising a metal such as aluminum or copper) may be optionally deposited upon the backside of substrate 500. The backside interconnect layer 522 allows for a thinner substrate to be used resulting a lower $Rds_{on}$ as well as reduced damage from the die saw process. In addition, heat dissipation is improved with the use of conductive layer 522 due to conductive layer 522 acting as a heat spreading layer.

Depending upon the application, certain steps of the above process may be combined or even separated, and certain steps may be performed in other order or sequence. Other steps may be added or steps may be omitted depending upon the embodiment.

Figure 6:
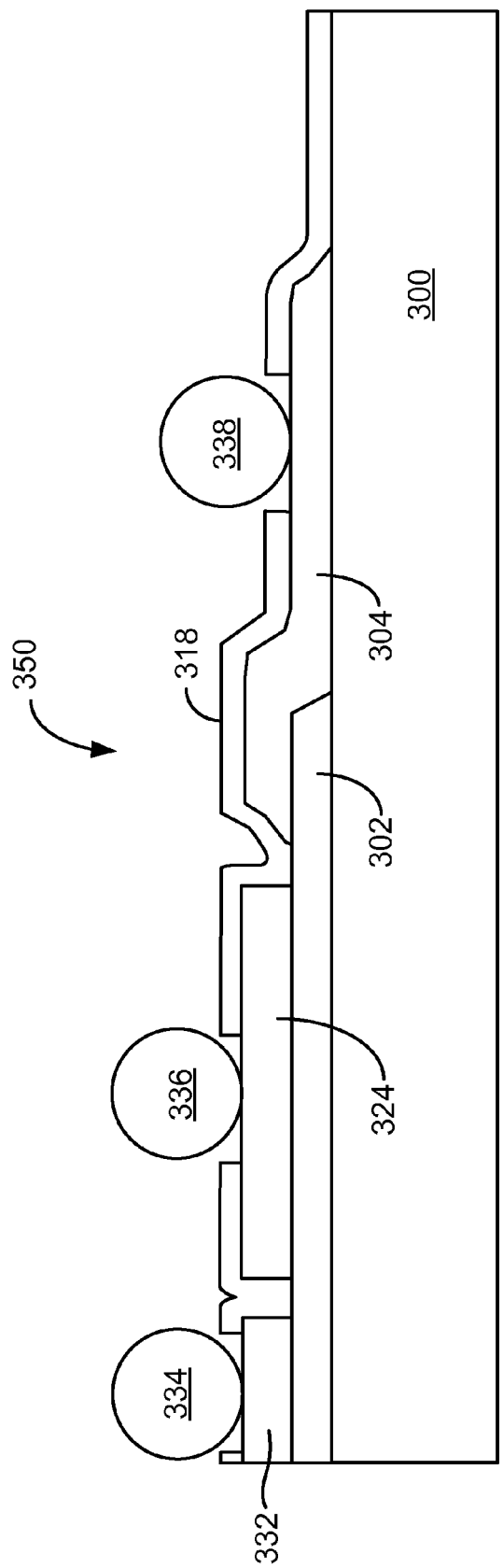
FIG. 6 is a simplified cross sectional view along cut line B-B in FIG. 2.

FIG. 6 is a simplified diagram corresponding to a sectional view along cut line B-B in FIG. 2 with solder balls included. Device 350 may be a vertical MOSFET and includes substrate 300 and an epitaxial layer 302 partially extending over substrate 300. Note that much of the details are not shown for clarity. Three interconnect layers 332, 324, 304 are shown along the topside. Interconnect layer 332 represents the gate interconnect and shows the general area where a gate bond wire or a solder ball 334 is placed. Interconnect layer 324 represents the source interconnect and shows the general area where a source bond wire or solder ball 336 is placed. Interconnect layer 304 contacting substrate 300 represents the drain interconnect. The general area where drain interconnect 304 receives a bond wire or solder ball 338 is also shown. While drain interconnect 304 directly contacts substrate 300, gate interconnect 332 and source interconnect 324 do not directly contact substrate 300. For example, where device 350 is a MOSFET, source interconnect 324 contacts source and body regions formed in epitaxial layer 302.

As shown, solder balls 334 and 336 are respectively in contact with gate interconnect 332 and source interconnect 324 at a first height, while the drain solder ball 338 in contact with drain interconnect 304 is at a second, lower height. In an exemplary embodiment, the difference between the first and second heights may be 5 μm. In an alternate embodiment where the manufacturing process provides for two layers of metal, the three solder balls 334, 336, 338 are formed on the same plane as follows. Interconnect layers 332, 324, 304 are formed using the first layer metal. The second layer metal contacts drain interconnect 304 and extends over a region of epitaxial layer 302 where the first layer metal does not extend. Thus, the portion of the second layer metal extending over the epitaxial layer is in the same plane as interconnect layers 332 and 324. The drain solder ball can then be placed over the portion of the second layer metal that extends over the epitaxial layer. Thus, the topside contact formed according to embodiments of the present invention advantageously enables chip-scale packaging (CS) of discrete devices, such as vertical MOSFETs. Many other configurations for the solder balls and contact pads enabling use of various packaging technologies could be envisioned by those of skill in the art.

Note that while embodiments of the invention are described in the context of a MOSFET, the invention is not limited in application to MOSFETs only. The invention may be implemented in any device, particularly vertically conducting device, where a topside contact to the substrate is desirable. FIGS. 7A-7C are provided to illustrate application of the invention in a number of exemplary vertical devices. In FIGS. 7A-7C, the cross section view in FIG. 3 is reproduced with a portion of the active region 202 enlarged to show details of few possible vertical devices. FIG. 7A shows a simplified cross section view of a conventional vertical trench gate FET. FIG. 7B shows a simplified cross section view of a conventional vertical shielded gate FET. FIG. 7C shows a simplified cross section view of a vertical planar gate FET. In each of FIGS. 7A-7C, the bottom layer corresponds to substrate 300, and the overlying region marked as n-(p-) corresponds to epitaxial layer 302. In all FIGS. 7A-7C, the conductivity type of the various regions not in parenthesis correspond to an n-channel MOSFET, and the conductivity type of the regions indicated in parenthesis correspond to a p-channel MOSFET. Further IGBT variations of the MOSFETs can be obtained by merely reversing the conductivity type of the substrate as indicated in each of FIGS. 7A-7C.

FIGS. 7A-7C also include: a body region in the epitaxial layer, the body region and the epitaxial layer may be of opposite conductivity type; a source region may be in the body region, the source and body regions may be of opposite conductivity type; and a gate electrode may be extending adjacent to but insulated from the body region, the gate electrode may be overlapping the source regions. A heavy body region may be in the body region; and a source interconnect layer may be electrically contacting the source regions and the heavy body regions. A gate electrode may extend in a trench formed in the body region as in FIGS. 7A-7B. The trench may further include a shield electrode under the gate electrode as in FIG. 7B. Alternatively, the gate electrode may be a planar gate as in FIG. 7C.

While the above is a complete description of specific embodiments of the present invention, various modifications, variations, and alternatives can be envisioned by one skilled in the art in view of this disclosure. For example, while the invention is illustrated using FETs, the invention could easily be applied to other type of types of devices such as vertically conducting rectifiers (including schottky rectifiers and TMBS rectifiers), vertically conducting diodes, and SynchFET's™ (having a FET and schottky diode integrated on one die). Hence, the scope of this invention should not be limited to the embodiments described herein, but are instead defined by the following claims.

What is claimed is:

1. A method of forming a semiconductor device comprising:
    forming an epitaxial layer on a topside surface of a semiconductor substrate, a sidewall of the epitaxial layer defining a recessed region along a periphery of the semiconductor device;
    forming a highly doped implant region in the sidewall of the epitaxial layer and an upper portion of the recessed region;
    forming an active device structure in an active area of the epitaxial layer;
    forming a termination region in the epitaxial layer, the termination region being disposed between the active area and the recessed region; and
    forming an interconnect layer disposed on at least a portion of the termination region, at least a portion of the sidewall of the epitaxial layer, and at least a portion of the recessed region, the interconnect layer being configured as a topside contact to the semiconductor substrate.

2. The method of claim 1, wherein forming the epitaxial layer includes performing a selective epitaxial growth process.

3. The method of claim 1, wherein forming the termination region includes forming one or more active area termination structures.

4. The method of claim 1, wherein forming the termination region includes forming at least one of a field oxide region in the epitaxial layer or a dielectric layer disposed on the epitaxial layer.

5. The method of claim 1, wherein the recessed region is configured as a drain terminal of the semiconductor device, and the forming the active device structure in the active area includes:
    forming a gate of the semiconductor device; and
    forming a source terminal of the semiconductor device.

6. The method of claim 1, wherein the termination region surrounds the active area.

7. The method of claim 1, wherein the recessed region is configured to provide an equal potential ring around the active area.

8. The method of claim 1, wherein the sidewall of the epitaxial layer has a slope between 45 degrees and 90 degrees.

9. The method of claim 1, further comprising forming a conductive layer on a backside surface of the semiconductor substrate.

10. The method of claim 1, wherein the recessed region is defined using an etch process to remove a portion of the epitaxial layer, the etch process forming the sidewall of the epitaxial layer.

11. A method of forming a semiconductor device comprising:
    forming an epitaxial layer on a topside surface of a semiconductor substrate, a sidewall of the epitaxial layer defining a recessed region along a periphery of the semiconductor device, the epitaxial layer including a notched active area;
    forming a highly doped implant region in the sidewall of the epitaxial layer and in an upper portion of the recessed region;
    forming a termination region in the epitaxial layer, the termination region being disposed around a perimeter of the notched active area; and
    forming an interconnect layer disposed on at least a portion of the termination region; at least a portion of the sidewall of the epitaxial layer and at least a portion of the recessed region, the interconnect layer being configured to function as a topside contact to the semiconductor substrate.

12. The method of claim 11, further comprising forming an active device structure in the notched active area, the active device structure including a gate of the semiconductor device and a source terminal of the semiconductor device, the recessed region functioning as a drain terminal of the semiconductor device.

13. The method of claim 11, wherein the recessed region forms an equal potential ring around the termination region.

14. The method of claim 11, wherein forming the termination region includes forming at least one of a field oxide region in the epitaxial layer or a dielectric layer disposed on the epitaxial layer.

15. The method of claim 11, wherein the sidewall of the epitaxial layer has a slope between 45 degrees and 90 degrees.

16. A method of forming a semiconductor device comprising:
   forming an epitaxial layer on a topside surface of a semiconductor substrate, a sidewall of the epitaxial layer defining a recessed region along a periphery of the semiconductor device;
   forming a highly doped implant region in the sidewall of the epitaxial layer and in an upper portion of the recessed region;
   forming an active device structure in an active area of the epitaxial layer;
   forming a termination region in the epitaxial layer, the termination region being disposed between the active area and the recessed region around a perimeter of the active area; and
   forming an interconnect layer disposed on at least a portion of the termination region, at least a portion of the sidewall of the epitaxial layer, and at least a portion of the recessed region, the interconnect layer being configured to function as a topside contact to the semiconductor substrate.

17. The method of claim 16, wherein forming the termination region includes forming one or more termination structures.

18. The method of claim 16, wherein the recessed region is configured as a drain terminal of the semiconductor device, and the forming the active device structure in the active area includes:
   forming a gate of the semiconductor device; and
   forming a source terminal of the semiconductor device.

* * * * *